US007894270B2

(12) United States Patent
Choi et al.

(10) Patent No.: US 7,894,270 B2
(45) Date of Patent: Feb. 22, 2011

(54) DATA RESTORATION METHOD FOR A NON-VOLATILE MEMORY

(75) Inventors: Jeong Y. Choi, Palo Alto, CA (US); Stephen Fung, Cupertino, CA (US)

(73) Assignee: MoSys, Inc., Santa Clara, CA (US)

( * ) Notice: Subject to any disclaimer, the term of this patent is extended or adjusted under 35 U.S.C. 154(b) by 89 days.

(21) Appl. No.: 12/378,248

(22) Filed: Feb. 11, 2009

(65) Prior Publication Data

US 2010/0202203 A1    Aug. 12, 2010

(51) Int. Cl.
*G11C 16/06* (2006.01)
(52) U.S. Cl. .......................... 365/185.25; 365/185.09; 365/185.21
(58) Field of Classification Search ............. 365/185.25
See application file for complete search history.

(56) References Cited

U.S. PATENT DOCUMENTS

| 6,668,303 | B2 | 12/2003 | Pio |
| 6,707,714 | B2* | 3/2004 | Kawamura ............. 365/185.11 |
| 6,731,557 | B2 | 5/2004 | Beretta |
| 6,751,766 | B2 | 6/2004 | Guterman et al. |
| 7,095,669 | B2 | 8/2006 | Oh |
| 7,319,617 | B2 | 1/2008 | Park |
| 2003/0066017 | A1 | 4/2003 | Kuwamura |
| 2007/0101238 | A1* | 5/2007 | Resnick et al. ............. 714/763 |
| 2008/0022179 | A1 | 1/2008 | Lee |
| 2008/0250299 | A1 | 10/2008 | Maillet et al. |
| 2008/0304327 | A1 | 12/2008 | Elmhurst et al. |

OTHER PUBLICATIONS

Search report for PCT/US2010/000375 dated Aug. 19, 2010.

* cited by examiner

*Primary Examiner*—Son L Mai
(74) *Attorney, Agent, or Firm*—Isabelle R. McAndrews

(57) ABSTRACT

A method and apparatus for selectively restoring data in a non-volatile memory array based on failure type. Weakened data and erroneous data are identified by performing two readings of a specific memory section. Alternatively, an error correction code is used after a first reading of data to identify erroneous data. The manner in which data is restored will depend on whether the data changed because of an erase failure or a program failure. If only a program failure occurred then the data will be reprogrammed without an intervening erase step. If the data experienced an erase failure, then the data will be erased prior to being programmed with correct data.

11 Claims, 6 Drawing Sheets

DATA RESTORATION METHOD FOR A NON-VOLATILE MEMORY

RELATED APPLICATIONS

The present application is related to "Automatic Refresh for Improving Data Retention and Endurance Characteristics of an Embedded Non-volatile Memory in a Standard CMOS Logic Process" by Stephen Fung filed on Feb. 11, 2009 and assigned to Mosys, Inc. The aforementioned patent application by Stephen Fung is incorporated by reference herein.

DISCUSSION OF RELATED ART

U.S. Pat. No. 6,668,303 B2 to Pio discusses a process for refreshing a non-volatile memory in which each memory cell is read twice. In particular, a standard read of the memory cell is first performed, and then a second read of the same memory cell is performed under more critical sensing conditions. In other words, the second read operation is performed at a higher threshold voltage than the first read operation. The time for refreshing a page of the memory is on the order of milliseconds.

U.S. Pat. No. 7,319,617 B2 to Park discloses a refresh procedure for a defective programmed cell. Park's refresh procedure uses two readings of each memory cell: a normal read and then a relaxed read. The relaxed read is performed in about 24 ns, which is 4 ns longer than the normal read. Consequently, the second read is performed after completing an embedded erase and programming of a selected sector of data. The programmed cells in Park tend to become more programmed when they become disturbed. In addition, erased cells in Park appear like programmed cells when they are disturbed. In reality, there is no precise method of determining whether a failure in Park occurred in a programmed cell or in an erased cell. Park only provides additional programming for weakly programmed or disturbed cells. It is implicitly assumed that failures occur only on programmed cells.

SUMMARY OF THE INVENTION

The present invention concerns a method for restoring data in a non-volatile memory. More specifically, data that has been corrupted as a result of charge loss or charge gain is identified by performing consecutive reads. Thereafter the data failure is corrected depending on the nature of the failure.

In a first embodiment, the invention concerns restoring data in a non-volatile memory having a combination of programmed and erased cells by performing a first read of a selected row at a first frequency; and then performing a second read of the same row at a second frequency. The second read is performed at a slower frequency than the first frequency, and thus the second read transpires over a longer time period. The data read in both readings is then compared to determine if a data mismatch has occurred. The manner in which errors are corrected will differ depending on whether the data mismatch occurred in any erased cell, or the data mismatch occurred in programmed cells only.

A second embodiment of the invention concerns restoring data in a non-volatile memory by using a hybrid refresh procedure that incorporates an error correction code. Specifically, this embodiment includes performing a first read of a selected row of data at a first frequency; and then determines whether any error in said row may be correctable by an error correction code. If a multi-bit error is detected then a second read of the same row is performed. This embodiment allows for further processing of the row of data based on whether errors are found in any erased cell or programmed cells only.

DETAILED DESCRIPTION

The refresh operation of the present invention is initialized by either a user command or internally as a result of a normal operation. It would be desirable to construct a memory device in which the impact of refresh operations on external memory access is minimized. Accordingly, the present invention provides a memory system in which the majority of refresh operations are carried out within the memory device during idle memory cycles. Idle memory cycles are clock cycles in which there is not an on-going or pending access to the memory device. An idle memory cycle would also include the period during which a device is being powered up.

Figure 1:
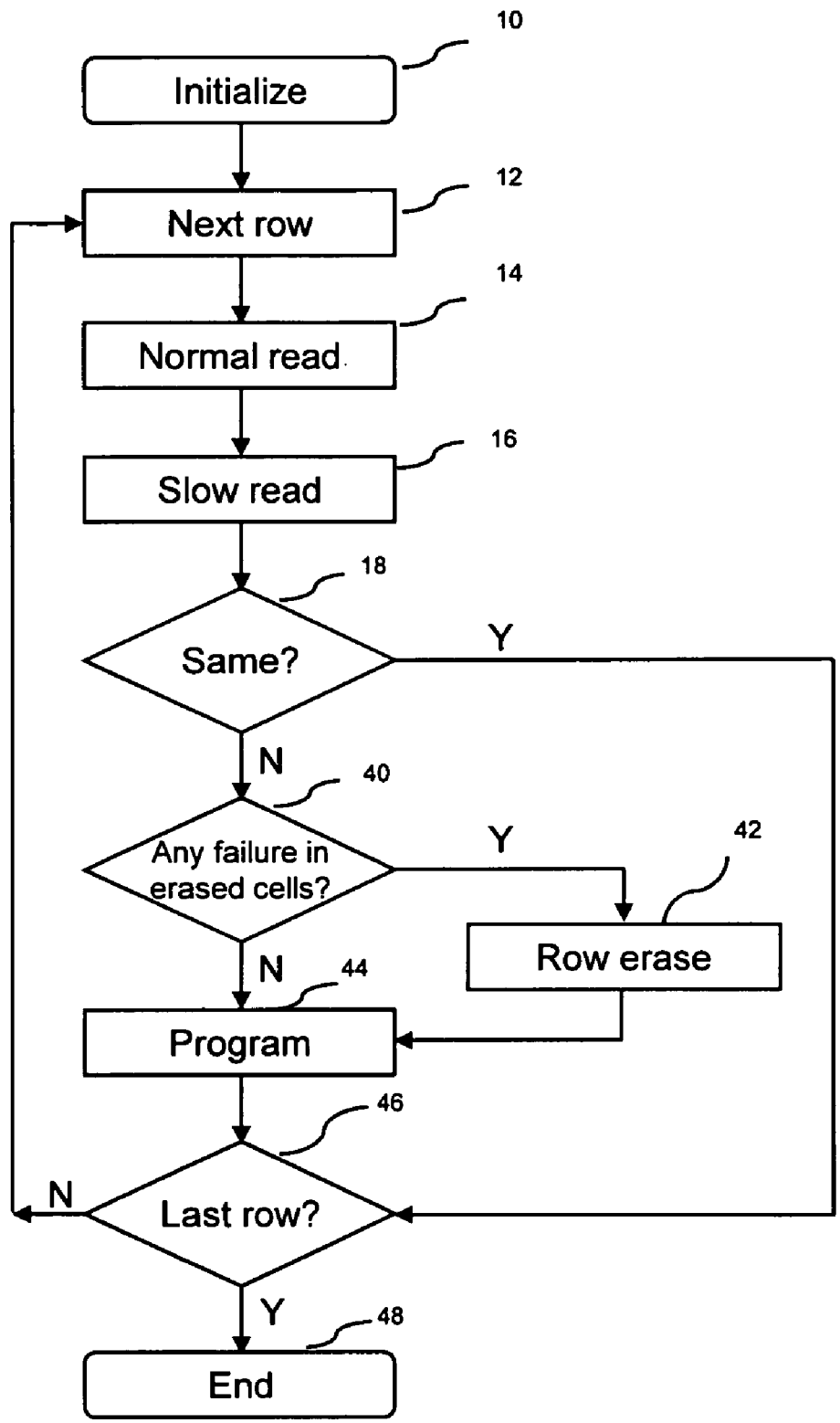
FIG. 1 is a flowchart of a method for refreshing a nonvolatile memory in accordance with a first embodiment of the present invention that relates to single-bit and multi-bit failures.

Two embodiments of the present invention are discussed for restoring data that has deteriorated due to charge loss. FIG. 1 illustrates a Double-Read Refresh method that can be used to correct multi-bit errors, as well as single bit errors. The refresh operation of FIG. 1 is capable of correcting multi-bit errors within the same word. The embodiment of FIG. 1 is most useful in instances when a device or system that contains the non-volatile memory is powered up after a long period, (such as one or more years) of being off.

The Double-Read Refresh method will now be described in conjunction with FIG. 1. In FIG. 1, the strength of a row of memory is tested by two consecutive readings. The refresh operation of FIG. 1 can anticipate a failing cell since any weakened cell will be detected after the two readings that are conducted at different frequencies. After initialization (step 10), a row address is requested (step 12) from memory by the refresh controller. The requested row is read at normal conditions (step 14) that is at the standard frequency of the part being tested. As used herein, standard frequency refers to the rate (cycles/sec) at which the memory transfers data. Typically, the normal read may occur over a frequency period of 2-20 nanoseconds. It is understood, that the standard frequency will vary based on the applications and technologies. Thus for a 10 MHz device the normal read will be slower than for a 20 MHz device. After the first read, the same row is read again in step 16 at a slower frequency than the normal read. For a slow read, the frequency period may range from 70-1000 nanoseconds. For each read, the row of memory cells may be read in chunks of byte, word, or multiple words at a time in as many steps necessary to read the entire row. In other embodiments, the entire row may be read at once._If the data read at the two different frequencies are the same (step 18), then the algorithm checks to determine whether additional rows of memory need to be evaluated in step 46.

Alternatively, if a data mismatch is detected after the two readings, then the refresh operation must determine what type of failure caused the mismatch to occur (step 40). The failure may have been caused by either a loss of data in an erase cell or in a programmed cell. If data is lost in a programmed cell, then it will be treated as a program failure. As used herein, a program failure means the failure of program cells during normal use due to charge loss that occurs as a result of an endurance fault or a data retention fault. A program failure is not to be confused with a failure that occurs as a result of a defect in any computer program that is used with a device that includes the programmed cells of the non-volatile array. An erase failure is defined herein as a memory cell whose erased cell voltage decreases to a great enough degree that it is no longer sensed by sensing circuitry as being in an erased state. In certain embodiments, if the erased cell voltage decreases by 50%, an erase failure will result.

If any erased cell experienced data loss then the entire row will be erased in step 42. Otherwise, if no failure was found in erased cells, then the refresh operation will program the row with correct data in accordance with step 44. The operation continues in step 46 by determining whether the last row of the memory has been read or not. If additional rows remain to be read, the refresh procedure will advance to the next row in step 12. Thereafter, the aforementioned process is repeated until the last row 46 is reached and all rows are deemed to contain correct data, or are all corrected in the manner described herein.

The implementation of the refresh operation of FIG. 1 will now be described in conjunction with the block diagram of FIG. 2. Memory block 100 of FIG. 2 includes memory array 110, page buffer 130, comparator 125, input buffer 122, refresh controller 150, wordline decoder 155, and bias generator 120.

Figure 2:
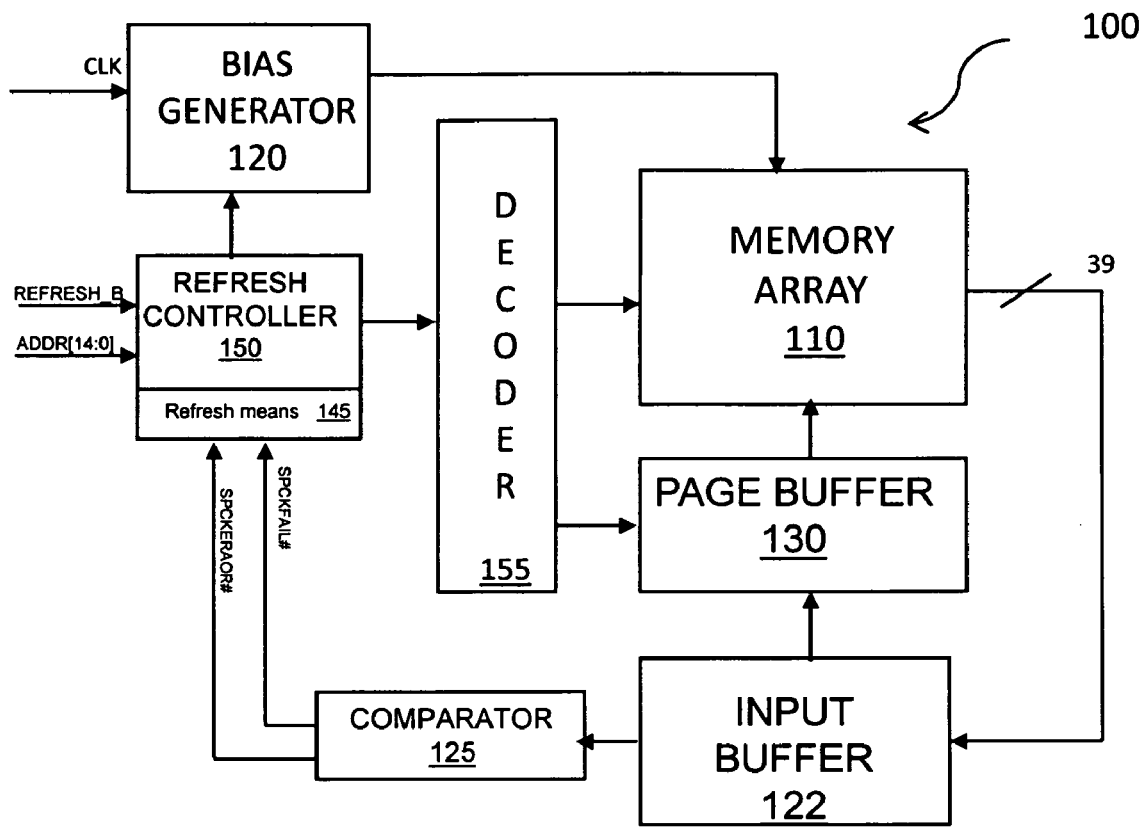
FIG. 2 is a block diagram of the embedded memory in accordance with the embodiment of FIG. 1.

In FIG. 2 word line decoder 155 is shown as being coupled to memory array 110. Memory array 110 has 64 k rows and 32 columns yielding 2 megabits of memory in one embodiment. However, it is understood that in other embodiments, memory array 110 can have a different size and configuration, thereby requiring other external address signals. Suitable sizes for the memory array 110 can range between 1 megabit up to 64 megabits. In one embodiment, the memory array is composed of NOR-type memory cells. However, the invention is also applicable to NAND-type flash memories as well.

Decoder 155 selects a row of data from memory 110 based on the address requested by refresh controller 150. Specifically, refresh controller 150 provides the necessary address and control signals internally to word line decoder 155 to select the desired row from memory array 110. In turn, decoder 155 provides the address and access signal to array 110. In a first cycle, a first word will be read at the addressed page. Subsequently, in the next clock cycle a second reading of the first word is performed. Preferably, the second reading occurs after the rising edge of the second clock cycle and at a slower frequency than the first reading.

Refresh controller 150 can also initiate access to the memory array via the bias generator 120 by providing a refresh enable signal REFRESH_B to bias generator 120. In particular, the external access to memory 110 is detected at the rising clock edge on the activation of the REFRESH_B signal. Bias generator 120 generates a bias voltage for accessing the memory cells of memory 110.

Once a specific row is requested, the row is read out to input buffer 122. Subsequently, the same or row is read a second time, but at a slower frequency. The data read in the second reading is also placed in input buffer 122. Thereafter, comparator 125 compares the two readings to determine whether a mismatch exists. If a mismatch exists, the comparator will generate a signal as described below.

The data read during both readings is stored in input buffer 122. Comparator 125 compares the two pieces of data from input buffer 122. If an inconsistency is detected in the data from the two readings, the comparator will generate a SPEED CHECK FAIL signal (SPCKFAIL#). In addition, the comparator also will determine what type of failure caused the mismatch in data. Specifically, if an erase failure prompted the word to lose charge then the comparator will generate a SPEED CHECK ERASE ERROR signal (SPCKERACOR#). The above steps are repeated for each word in a specific row. In other words, each word of a specific row of data will be sequentially evaluated by comparator 125.

If comparator 125 fails to detect any mismatch in data, then refreshing of the row is complete and the row is not altered. The user may not desire to refresh more than one row of data. However, if the user wishes to refresh more than one row of data, then the user can provide a new address to the refresh controller.

If all words of an addressed section of memory, such as a row, page, or the entire memory array are determined to be error-free, then the refresh operation of FIG. 1 is complete. In actuality, no refresh operation is performed on an error-free page. This method of performing refresh is selective because if the bits are read out properly, without any errors, then it is unnecessary to subject the row to a refresh operation. Thus, an error-free row will simply be read and no erase or program steps will occur.

If on the other hand, the row is determined to include defective bits, a signal is generated by comparator 125 to alert refresh means as to what action to take.

In one embodiment, the signal generated by the comparator in FIG. 2 may be a global flag that changes state when an error is detected. The signal will provide the system with information regarding the type of failure that resulted in a data mismatch from the consecutive readings of the same data. If the failure type arose from an erased bit, then comparator 125 provides a SPCKERAOR# signal to refresh means 145. A SPCKERAOR# signal indicates that the entire row containing the erase failure must be erased prior to programming in accordance with step 42 of FIG. 1. Subsequent to erasing a row containing an erase failure, programming of correct data can begin immediately. After programming, the device is free to be accessed for any purpose and the refresh is complete. On the other hand, if the comparator only provides the refresh means with a SPCKFAIL# signal, then it is unnecessary to erase the row in order to perform a refresh. More specifically, a row that experienced charge loss, that is not deemed to contain an erase failure, can be immediately programmed without an intervening erase step. Preferably, only the defective bits within a row having a program failure are corrected by reprogramming. Specifically, it is not necessary to program any of the bits that are in a correct state within a row. Instead, it is only necessary to program the bits that experienced a program failure within a single row. Although in less preferred embodiments, it may be acceptable to program an entire row where a portion of the row contains a program failure. All embodiments set forth herein that concern data containing program failures are correctable by programming only the specific defective bits, or by programming the entire chunk of data with new data.

In summary, the comparator evaluates each word of a row for consistency and when a mismatch in data is found, the comparator signals the refresh means with the failure type that triggered the error. After a row has been completely evaluated by comparator 125, the refresh means will proceed to correct the errors based on the failure type. If the page is error free then no changes to the row-will be made.

The input buffer is coupled to refresh controller 150 to receive addressing commands and thereby load corrected data into the desired location of memory 110. Coupled to input buffer 122 is a page buffer 130 that receives a complete row of data from the input buffer if any of the words from the first and second reading are determined to be inconsistent with each other.

The refresh means is located within refresh controller 150, and may constitute either circuitry or hardware that is generated by HDL code. Suitable types of HDL code for generating the hardware for the refresh means include Verilog, VHDL, or other comparable Hardware Description Language (HDL). Such HDL code would implement each of the steps shown in FIG. 1. An example of refresh means that is implemented in hardware is a circuit that follows the state machine of FIG. 3. The state machine controls operation of refresh controller 150. Refresh means can be a circuit that receives signals indicating the type of failure that resulted in a data mismatch from the consecutive readings of the same data. The refresh circuit can be implemented using logic gates, multiplexers, and inverters that accomplish the various states in the order shown by the state machine of FIG. 3.

Figure 3:
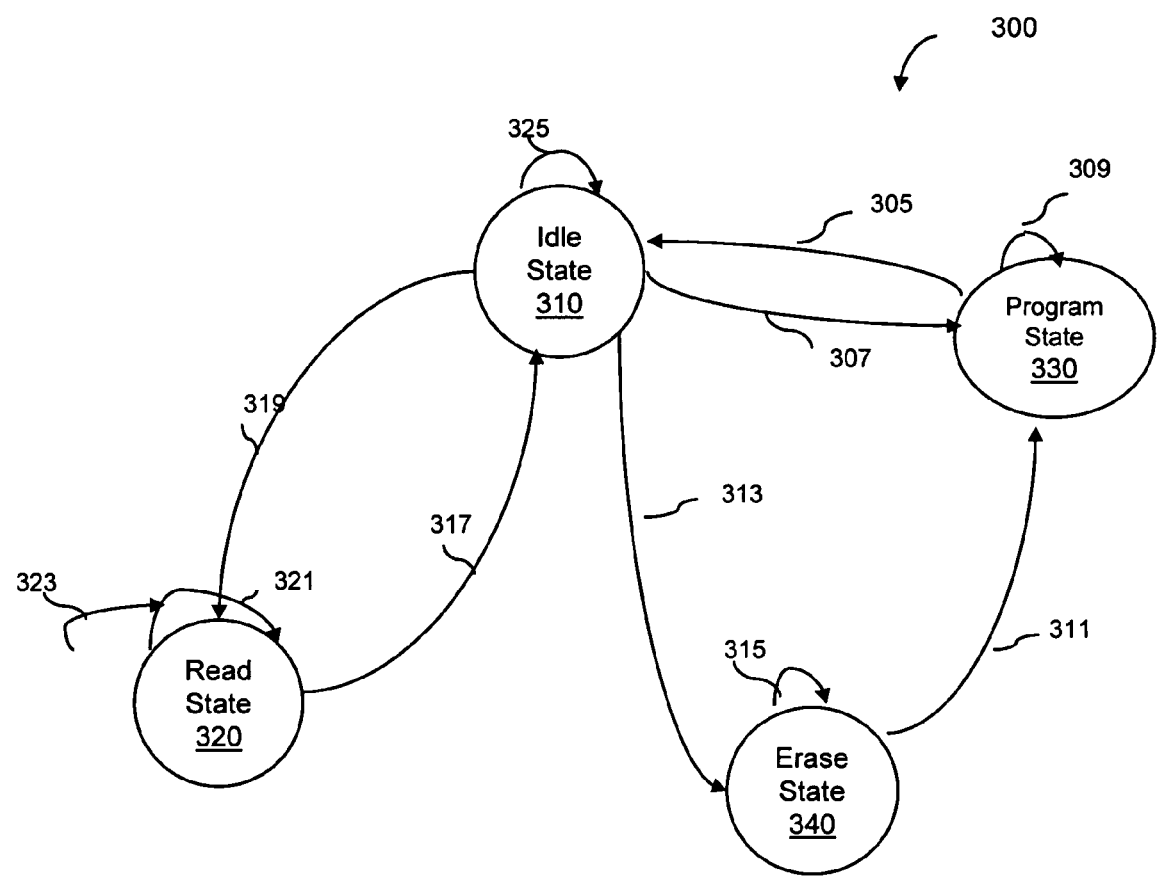
FIG. 3 illustrates a state machine for controlling operation of the refresh operation of FIG. 1.

It is understood that the device may be a computer, media player, or any other apparatus embedded with non-volatile memory. As shown in FIG. 3, the device cycles in an idle state 325 until either the user or the device itself issues a refresh command. More specifically, a refresh operation from the idle state 310 is started during transition 319, where the device changes from being idle to the read state 320. The device remains in the read state by continuously reading as shown by 321 until the requested row has been completely read. When the state of completely reading the row 323 is reached, the idle state 310 is again entered via transition 317. At which point, the presence of an error in the row read will determine whether transition 313 or 307 is taken. If an error is detected in any erased cell, that is if an erase failure is detected in the data read, then the idle state enters erase state 340 via transition 313. The device continues to erase 315 until the row with the defective bit is corrected. When the erase is complete, the erase state enters program state 330 via transition 311 to enable the erased row to be programmed with correct data. Programming of the row continues at 309 until complete. When complete, the refresh operation returns to idle state 310 via transition 305.

The state machine operates differently if the error detected occurred in programmed cells only. Specifically, if only a program failure occurred in the row that was read, the idle state 310 enters program state 330 through transition 307. The device will continue to cycle in a program state 309 until the defective row is completely programmed. When programming is complete, the device will return to the idle state via transition 305.

Figure 4:
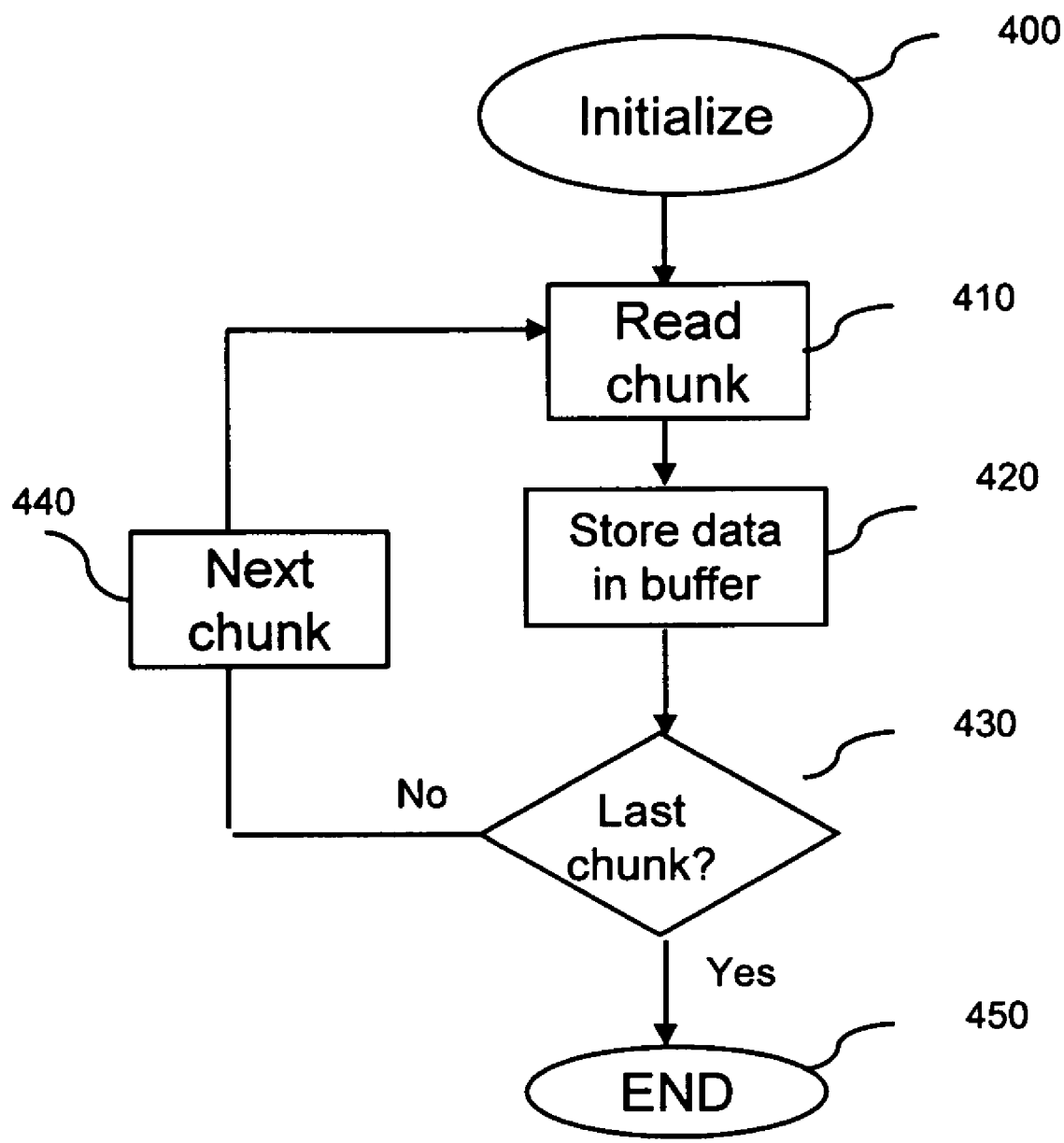
FIG. 4 is a flowchart of the manner in which a row or partial row of memory may be read in accordance with FIG. 1.

FIG. 4 illustrates the manner in which the normal and slow reads of each embodiment described herein operates. Reading is initialized at step 400 either automatically by the system or by the user. Subsequently, a chunk of data is read in step 410. As used herein the term chunk or chunks refers to either a byte (that is 8 bits of data); a double byte, a word (i.e., 32 bits), a double word, or other sizes of memory. After the chunk of data is read, it is stored in a buffer in accordance with step 420. Thereafter, in step 430, the device checks to determine whether the last chunk of data has been read. If additional chunks remain to be read, then the device retrieves the next chunk in step 440, otherwise the reading of data is complete and ends at step 450.

Figure 5:
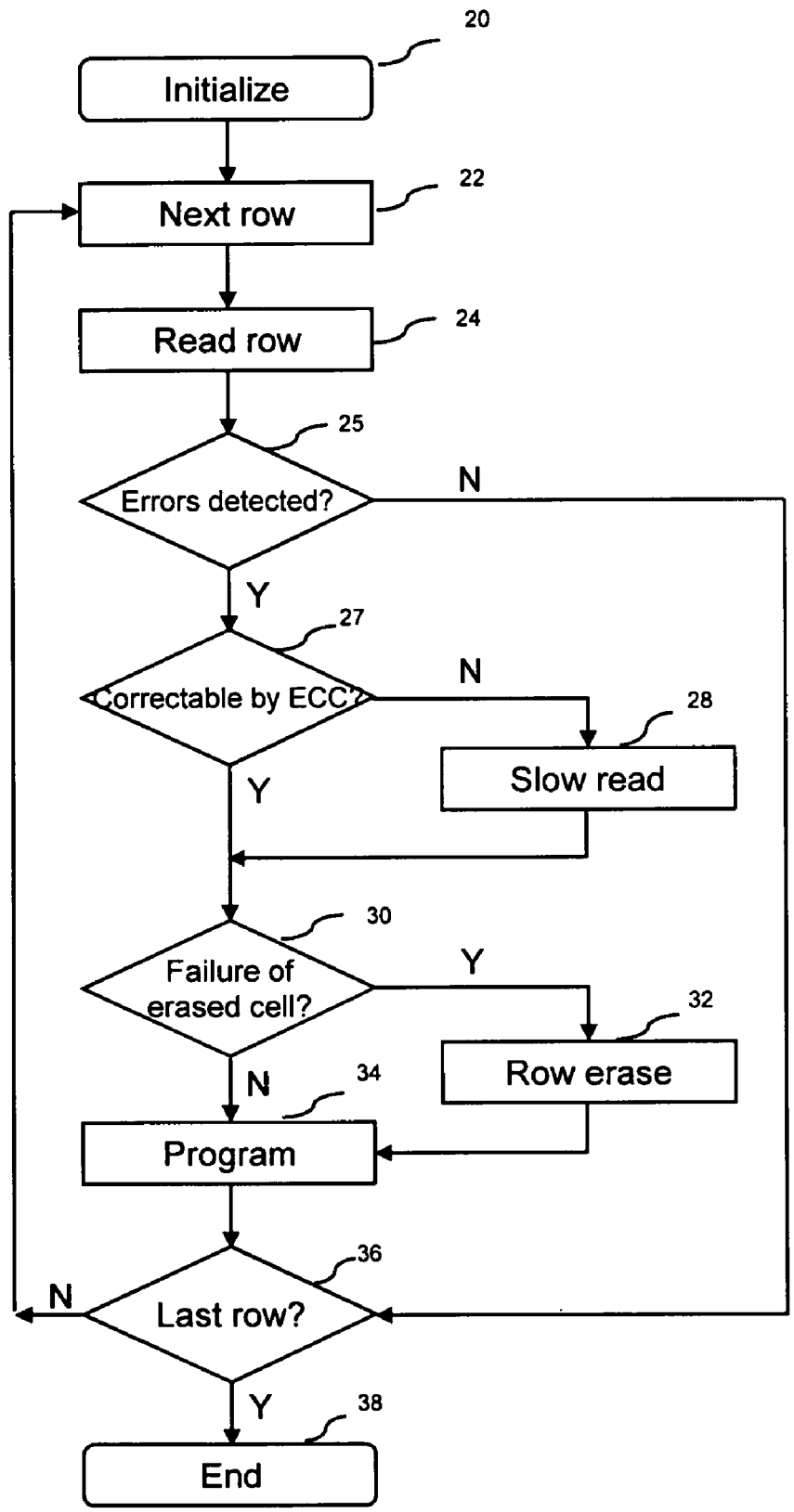
FIG. 5 is a flowchart of a method for refreshing a nonvolatile memory in accordance with a second embodiment of the present invention that relates to single-bit and multi-bit failures.

The present invention may also be performed in combination with a built-in error correction code as shown in FIG. 5. Although not limited to the example to be discussed, the refresh method of FIG. 5 corrects single-bit errors within a word or chunk of data, and is capable of detecting 2-bit errors. If a failure in a word is more than 2-bits, the error will pass as normal.

In general, for a multi-bit failure, the first error is corrected with error correction code, while the second error is corrected by a slow read.

In this embodiment, a hybrid refresh process is initialized in step 20, and a row is selected for evaluation in step 22. Thereafter, a first read is performed in step 24 under normal operating conditions (that is a "normal read"). The data read out in this step is stored in a buffer. If the data read out during a normal read is incorrect, then a decision is made in step 25 regarding whether the ECC circuitry detected any error. If no error is detected, then the data read is correct. At which point, the system must determine in step 36 if there are any further rows to be tested.

On the other hand, if an error is detected by ECC in step 25, then the error (or failure) will be corrected by ECC if the error is correctable, as determined in step 27. When the error detected is indeed correctable by ECC, then such failure is corrected based on the failure type. Specifically, the refresh process proceeds by correcting the row of data in a first manner if a data mismatch occurred in any erased cell; and if all data mismatches occurred in programmed cells, then correcting the data in a second manner, that is different from the first manner. Furthermore, if all failures are determined to be programmed cells in step 30, then the failed programmed cell is programmed in step 34 with correct data. However, if instead any failure occurred in an erased cell, then the row containing the erased cell is erased in step 32. Afterwards, the erased row is programmed in step 34.

The refreshing of failures that are not correctable by ECC proceeds in a different manner than the process described above. In accordance with step 28 of FIG. 5, a row containing the failure will be read a second time. The second read preferably proceeds at a slower frequency than the first read. Specifically, the slow read may be conducted at a frequency of ½ to ¹/₂₀ of that under normal operation. Performance of the slow read provides information for determining in step 30 whether the data loss occurred in an erased cell or not. If the data loss affected an erased cell then the procedure continues to step 32 where the row that was affected is erased. Otherwise if the data loss occurred in only programmed cells, then the failed cells will be reprogrammed in step 34 without any intervening erasure of data. Consequently, the reprogrammed cells will have their correct data restored. At which point, the procedure proceeds to step 36 in order to determine if there are any additional rows to be tested. When no further rows need to be tested, then the refresh procedure of FIG. 5 is complete as shown in step 38.

If numerous failures are detected during the first reading of a row or page, then the refresh operations of FIG. 1 and FIG. 5 will operate within similar time periods. In other words, the performance of the refresh operation in FIG. 1 should provide the same performance for a device that contains numerous errors, as would the refresh operation shown in FIG. 5. However, if the failure rate is relatively low, then the embodiment of FIG. 5 is expected to operate at greater speeds than the embodiment of FIG. 1. The effectiveness of the refresh operation of FIG. 5 is limited by the capability of the ECC that is used. For example, if the ECC is configured to detect two-bit failures per word, a 3-bit failure in a word would be undetectable. In any event, the method of FIG. 1 is able to detect even more massive failures than the method of FIG. 5.

The embodiment of FIG. 5 is preferably performed when the device or system is on, or when a data restoration process is initiated by the user. By contrast, if an apparatus containing the non-volatile memory is powered up after a long period of being off, then it is preferred to restore data by using the dual-frequency read method of FIG. 1.

Yet another embodiment for refreshing a non-volatile memory will be discussed in conjunction with FIG. 6. During normal operation, when the memory is being accessed, data is read in step 60. If an error is detected in step 62, then an error flag will change state in step 64 to indicate the presence of an error. Next, the method of FIG. 6 proceeds by determining whether or not the error is a single bit error. If a single bit error is found then it is corrected by the ECC in step 68, where the corrected data is also saved to an input buffer. Alternatively, if the error detected in step 62 is not a single-bit error than a slow read will be performed in step 70. The slow read corrects the faulty data, which is subsequently saved in correct format in an input buffer. Thereafter the corrected data is compared to the data read during the normal read of step 60 to determine whether an erase failure caused the error. If the error is attributable to an erase failure than an erase error flag is set, and the procedure continues by checking whether additional chunks of data must be evaluated in step 78.

If the last chunk of data has been evaluated for errors in step 78, then the next step to be performed will depend on what flags have been set. If no error flag is set, then the algorithm checks whether the last row of data has been evaluated in step 90. When no further rows remain to be evaluated for errors, then the next row in step 92 will be accessed. In which case, a normal read of the next row will be performed in step 60, and the next row will be subject to the routine of FIG. 6. On the other hand, if the error flag is set in step 82, meaning that the chunk contains faulty data, then the algorithm proceeds to step 84 to check whether an erase error flag is also set. If an erase error flag is set in step 84, than the chunk of data is erased in step 86, and then programmed with correct data in step 88. If the error in the chunk is not attributable to an erase failure, then the erase error flag will not be set, signifying that the error in the chunk is due to a program failure. In this case, the program failure will be corrected by programming either the defective program bits only, or programming the entire chunk with new data in step 88. After the chunk has been replaced with correct data, the algorithm will check whether or not the last row of data has been reached in step 90.

Figure 6:
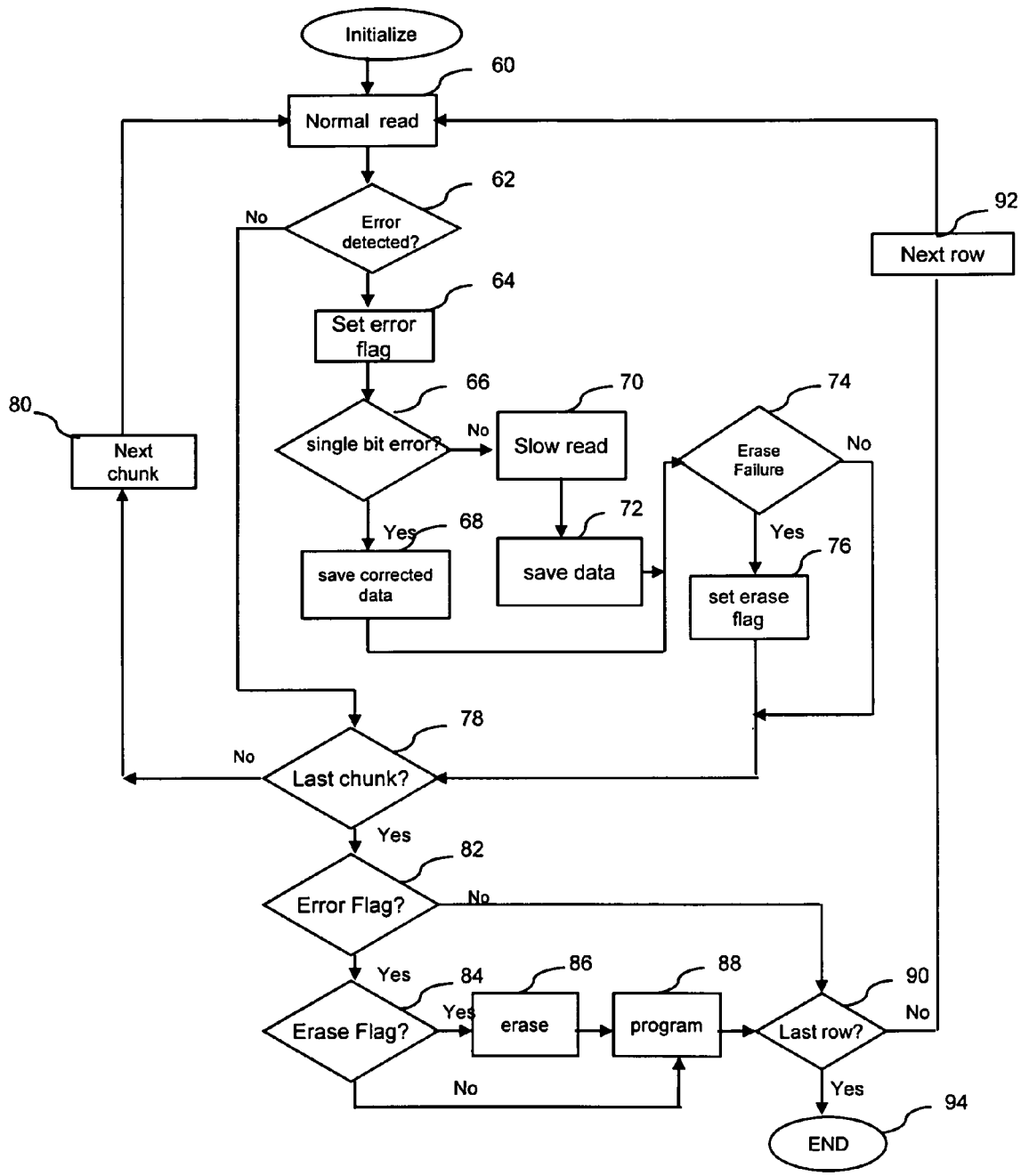
FIG. 6 is a flowchart of one manner in which the hybrid refresh of FIG. 5 may be performed in accordance with the present invention.

More specifically, a non-volatile memory containing chunks of data may be automatically refreshed when a normal read of a chunk of data is performed in accordance with FIG. 6. After the normal read the integrity of the chunk of data is checked with an ECC. If an error is detected in the chunk of data then a signal is sent to the system. This signal may consist of a series of flags that indicate the presence of an error, as well as the type of error that resulted in the defective data. When the device is no longer being accessed with reads or writes, then the device exits its active phase and a refresh cycle is automatically initiated. In this embodiment, the device checks the contents of the refresh address buffer to determine whether an address is stored therein. If the refresh address buffer contains an address, then the chunk of data corresponding to said address is retrieved and refreshed in a first manner if the error is attributable to an erase failure, while the chunk of data is corrected in a second manner if the error is attributable to only a program failure. By contrast, if the refresh address buffer is empty then a refresh operation is not performed on the chunk of data and the device remains in an idle stage until the next read access is received. Upon completing the refresh operation of the chunk of data, a normal read of new data is performed and if an error is detected in the new data, the refresh address buffer is provided with a new address that replaces the prior contents that was stored in the address buffer. In which case, the new address corresponds to the new data in which an error was detected.

The present invention is also directed to automatically performing a refresh operation of a non-volatile memory during a read that occurs separately from any type of refresh. In this embodiment, while a read is occurring during the normal operation of the device the data read is evaluated by an error correction code. The ECC is used to detect errors in the data read. If an error is detected in a chunk than the corresponding row address of the chunk containing the error will be saved to a refresh address buffer. After the device is no longer busy reading or writing, and exits the active phase, a check of the refresh address buffer (RAB) will be made. If the RAB is empty, then the device will remain in an idle mode until the next access is made. However, if the RAB is not empty, then a refresh cycle will be initiated.

The system retrieves the first row address and performs a refresh on the first address in the RAB in accordance with the method shown in either FIGS. 1, 3, 4, 5, or 6. After completing the refresh of the first row address, the system removes the first row address from the RAB and the RAB pointer is then moved to the next entry in the buffer. Thereafter, the system retrieves the next entry in the RAB, and checks to ensure that the next entry is not a duplicate of a prior address_that was refreshed within the current refresh cycle. While the system is still in idle mode the aforementioned refresh steps are repeated to correct any errors in data corresponding to distinct addresses stored in the RAB. In no event will data be refreshed if the address in the RAB is a duplicate of an address whose data was corrected during the current refresh cycle.

In the embodiment that uses an RAB, after each refresh cycle is complete the contents of the RAB is flushed, or the RAB pointer is reset to the initial value, and the device may remain in the idle mode, or it may enter the active mode where normal reads are performed. Of course, the system is informed of any error that is detected in a chunk by posting the address of the chunk containing an error in the RAB.

The present invention has been described by various examples above. However, the aforementioned examples are illustrative only and are not intended to limit the invention in any way. The skilled artisan would readily appreciate that the examples above are capable of various modifications. Thus, the invention is defined by the claims set forth below.

The invention claimed is:

1. A method for restoring data in a non-volatile memory having a combination of programmed and erased cells, the method comprising:
    selecting a row of the non-volatile memory;
    performing a first read of the row at a first frequency;
    determining whether an error exists in said row of data that is correctable by an error correction code (ECC);
    performing a second read of said row if the error is not correctable by ECC; and then further processing said row of data based on whether the error is found in any erased cell or programmed cells only.

2. The method of claim 1, wherein the second read of said row is performed at a frequency that is lower than said first frequency.

3. The method of claim 1, wherein the first read is performed at a frequency that corresponds to the standard operating frequency of the non-volatile memory.

4. The method of claim 1, wherein if the error is attributable to an erase failure, then the row is erased prior to programming the row with correct data.

5. The method of claim 1, wherein if the error is attributable to only a program failure, then the row is programmed with correct data without performing any intervening erase operation.

6. The method of claim 5, wherein the programming of the row is performed for only bits that are defective.

7. The method of claim 1, wherein the second read is performed at a frequency that is approximately ½ to ¹⁄₂₀ of the standard operating frequency of the non-volatile memory.

8. The method of claim 1, wherein the second read is performed prior to erasing the row of data containing incorrect data.

9. The method of claim 1, wherein the row of data is refreshed during an idle cycle of the memory array.

10. The method of claim 1, wherein the row of data is refreshed before the memory enters a shutdown mode.

11. The method of claim 9, wherein the row of data is refreshed during a power-up period.

* * * * *